United States Patent [19]
Ikeda

[11] Patent Number: 6,111,277
[45] Date of Patent: Aug. 29, 2000

[54] SEMICONDUCTOR DEVICE AS WELL AS LIGHT EMITTING SEMICONDUCTOR DEVICE

[75] Inventor: Masao Ikeda, Kanagawa, Japan

[73] Assignee: Sony Corporation, Tokyo, Japan

[21] Appl. No.: 09/176,270

[22] Filed: Oct. 21, 1998

[30] Foreign Application Priority Data

Oct. 24, 1997 [JP] Japan ................................. 9-293036

[51] Int. Cl.⁷ .................................................. H01L 33/00
[52] U.S. Cl. .......................... 257/99; 257/13; 257/81; 257/97; 257/99; 257/103; 257/82; 372/43; 372/70; 372/73; 372/75; 372/106; 438/510; 438/481; 438/519; 438/514; 438/46
[58] Field of Search .................................. 257/99, 13, 81, 257/82, 103; 372/43, 70, 73, 75, 106; 438/510, 481, 519, 514, 46

[56] References Cited

U.S. PATENT DOCUMENTS

| | | | |
|---|---|---|---|
| 5,768,182 | 6/1998 | Hu et al. ............................ | 365/145 |
| 5,798,537 | 8/1998 | Nitta ................................... | 257/103 |
| 5,861,636 | 1/1999 | Dutta et al. ......................... | 257/91 |

*Primary Examiner*—Matthew Smith
*Assistant Examiner*—Belur Keshavan
*Attorney, Agent, or Firm*—Hill & Simpson

[57] ABSTRACT

A semiconductor device such as a light emitting semiconductor device comprising a mask layer having opening areas and a selective growing layer comprising a semiconductor grown selectively by way of the mask layer, with each of the mask layer and the selective growing layer being disposed by two or more layers alternately. The semiconductor device is manufactured by a step of laminating on a substrate a mask layer having opening areas and a selective growing layer comprising a semiconductor grown selectively way of a mask layer, each by two or more layers alternately and a subsequent step of laminating semiconductor layers thereon. Threading dislocations in the underlying layer are interrupted by the first mask layer and the second mask layer and do not propagate to the semiconductor layer. The density of the threading dislocations is lowered over the entire surface and the layer thickness can be reduced.

17 Claims, 5 Drawing Sheets

SEMICONDUCTOR DEVICE AS WELL AS LIGHT EMITTING SEMICONDUCTOR DEVICE

BACKGROUND OF THE INVENTION

1. Field of the Invention

The present invention concerns a semiconductor device comprising, for example, a group III nitride compound semiconductor and a method of manufacturing thereof, as well as a light emitting semiconductor device

2. Description of the Related Art

In recent years, vigorous development has been conducted for light emitting semiconductor devices such as semiconductor lasers or light emitting diodes (LED) capable of emitting light in a range from a visible region to a UV-region by using Group III nitride compound semiconductors such as AlGaInN. Particularly, in the field of light recording, it has been demanded for attain practical use of a semiconductor laser capable of obtaining a light in a short wavelength region in order to improve the recording density, for example, of an optical disc.

Recently, in AlGaInN system semiconductor lasers, continuous oscillation for 300 hours at a room temperature has been attained by growing a layer comprising a Group III nitride compound semiconductor by way of a buffer layer on a substrate made of sapphire by means of a metal organic chemical vapor deposition (MOCVD) method (Jpn. J. Appl. Phys. 35, L74 (1996); and 36 L1059 (1997)). However, in view of the progress curve of a driving current during use, moderate increase is observed from the initial stage of voltage supply and it can be seen that degradation proceeds gradually. As the cause for the degradation, it is considered that the layer comprising the Group III nitride compound semiconductor formed on a substrate contains threading dislocations (dislocations in which dislocation defects are propagated and penetrate crystals) of about $1\times10^8$–$1\times10^9 N/cm^2$. Accordingly, it is necessary to reduce the density of threading dislocations in order to attain a practical working life of 10,000 hours or more, for which various studies have been made.

For example, one of such counter measures include, for example, a method of forming a GaN layer by way of a buffer layer on a sapphire substrate, laminating thereon a mask layer in which mask areas comprising silicon dioxide ($SiO_2$) strips each of 1 to 4 $\mu$m with at a pitch of 7 $\mu$m and then selectively growing a GaN layer laterally by a halide vapor deposition layer on the mask layer (Jpn. J. Appl. Phys, 36 L899 (1997)). According to this method, the density of the threading dislocations in the GaN layer formed on the mask layer can be reduced to about $1\times10^7 N/cm^2$, In this method, however, unevenness is liable to be caused on the surface of the GaN layer formed on the mask layer and it is difficult to obtain a planar surface. This is because, the GaN layer at first proceeds in the opening areas of the mask layer (that is, between each of the mask areas) to form a protuberance and then proceeds to a portion above the mask areas (that is, in the lateral direction) in the course of growing. Accordingly, in order to make the surface planar, it is necessary to increase the thickness of the GaN layer to at least 10 $\mu$m or more. Accordingly, this requires a long time for growing and results in various problems that defects or warps are formed due to disagreement of the lattice constant relative to the substrate made of sapphire.

Further, although propagation of the threading dislocation can be suppressed by selective growing in the lateral direction above the mask area, the threading dislocation from the GaN layer below the mask layer is continued as it is in the opening areas. Therefore, while the density of the threading dislocations is reduced in the regions above the mask areas, the density of the threading dislocations is maintained above the opening areas and, thus, the density can not be reduced as a whole. Accordingly, a light emitting region has to be formed exactly in the regions above the mask areas, which results in a problem that the degree of freedom in the manufacture is small, the manufacturing steps are complicated and manufacture is made difficult.

For the technique of selectively growing the GaN layer on the mask layer, a MOCVD method has also been reported in addition to the halide vapor deposition method (J. Crtst. Growth 144 133 1994)). However, this is not a report aiming at the selective growing on the mask layer. Further, a report examining the anisotropy upon selective growing on the mask layer by the MOCVD method has been made recently. According to this report, when a GaN layer is formed by way of a buffer layer on a substrate made of sapphire and a GaN layer is formed thereover by way of a mask layer in which a plurality of strip-like mask areas are formed in <11-20> direction, lateral growing is accelerated and growing of protuberance in the opening areas is suppressed to obtain a relatively planar grown surface closer to a C face under certain conditions (Appln. Phys. Lett 71 1204 (1997)). However, the report does not mention to the dislocation density but only shows the possibility of satisfactory crystal growing in the lateral direction.

The <11-20> direction mentioned herein should, exactly, be expressed by attaching an overline above a numerical figure as shown below but this is indicated herein by attaching "-" before the numerical figure (hereinafter, this convenient indication is used for such expression).

<11$\overline{2}$0>

SUMMARY OF THE INVENTION

The present invention has been accomplished in view of the foregoing problems and an object thereof is to provide a semiconductor device capable of lowering the density of threading dislocations over the entire surface and capable of reducing the layer thickness, and a method of manufacturing thereof, as well as a light emitting semiconductor device.

A semiconductor device according to the present invention comprises a mask layer in which opening areas are formed and a selective growing layer comprising a semiconductor which is grown selectively by way of the mask layer, with the mask layer and the selective growing layer being disposed each by two or more layers alternately.

A method of manufacturing a semiconductor device according to the present invention comprises:

a step of laminating on a substrate a mask layer having opening areas and a selective growing layer comprising a semiconductor which is grown selectively way of a mask layer, with the mask layer and the selective growing layer being disposed each by two or more layers alternately; and a step of laminating the mask layer and the selective growing layer each by two or more layers and then laminating semiconductor layers thereon.

In a light emitting semiconductor device according to the present invention, a first conduction type cladding layer, an active layer and a second conduction type cladding layer each comprising a semiconductor are at least laminated successively on a substrate, in which a mask layer has opening areas formed therein and a selective growing layer comprising a semiconductor grown selectively by way of the mask layer are laminated each by two or more layers alternately between the substrate and the first conduction type cladding layer.

In the semiconductor device according to the present invention, since the mask layer and the selective growing layer are disposed each by two ore more layers, propagation of threading dislocations in the laminating direction is interrupted and the density of the threading dislocations is lowered.

In the method of manufacturing the semiconductor device according to the present invention, since the mask layer and the selective growing layer are laminated each by two or more layers alternately, propagation of the threading dislocations in the laminating direction is interrupted. Then, semiconductor layers are laminated on them.

In a light emitting semiconductor device according to the present invention, when a voltage is applied between the first conduction type cladding layer and the second conduction type cladding layer, current is injected to an active layer to cause light emission. Since the mask layer and the selective growing layer are disposed each by two or more layers alternately between the substrate and the first conduction type cladding layer, propagation of the threading dislocations in the laminating direction is interrupted and the density of the threading dislocations in the first conduction type cladding layer, the active layer and the second conduction type cladding layer is reduced.

DESCRIPTION OF THE ACCOMPANYING DRAWINGS

DETAILED DESCRIPTION OF THE PREFERRED EMBODIMENTS

Preferred embodiments of the present invention will be explained with reference to the drawings.

Figure 1:
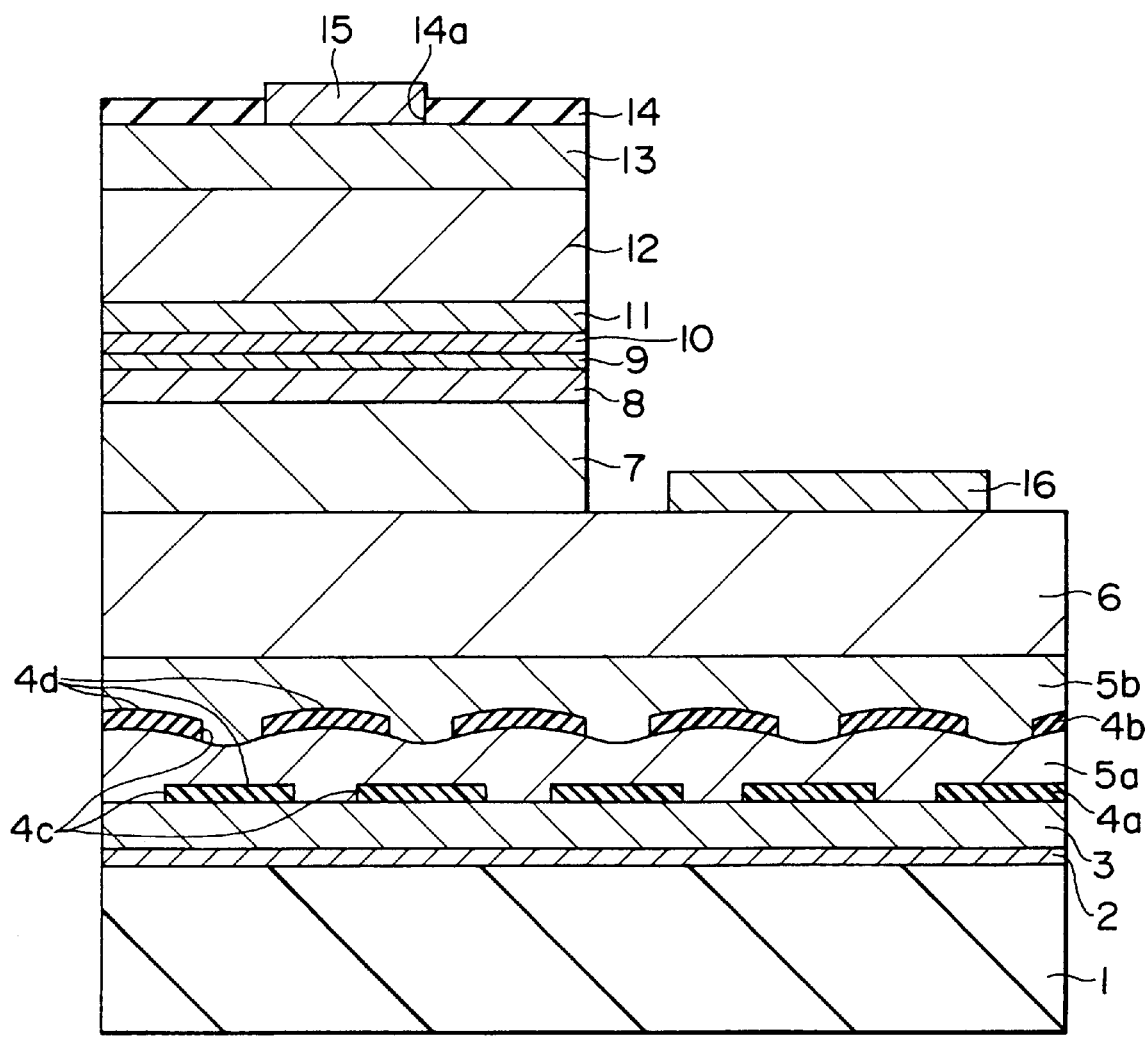
FIG. 1 is a cross sectional view illustrating a constitution of a light emitting semiconductor device in a first embodiment according to the present invention.
Figure 2:
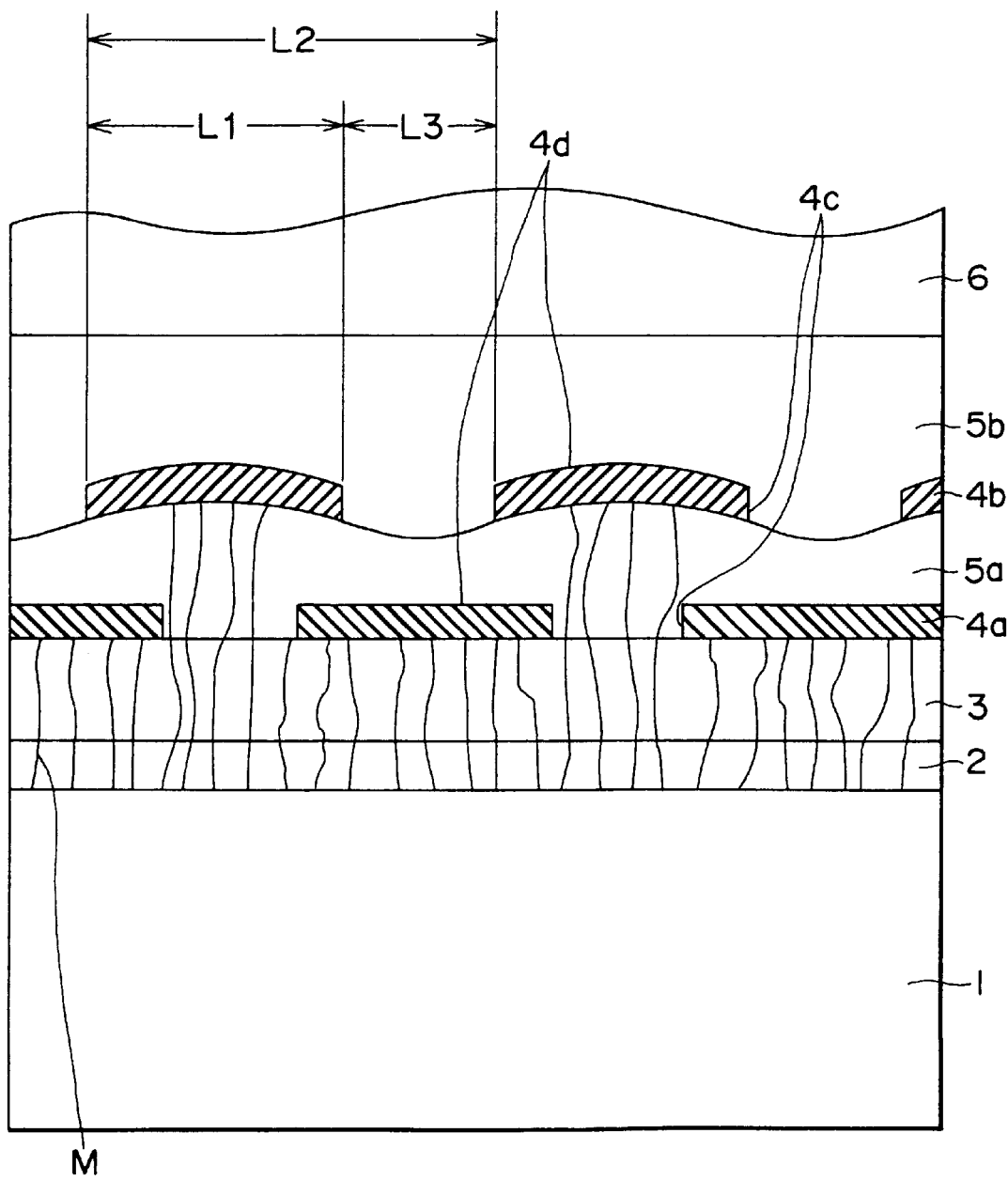
FIG. 2 is a cross sectional views illustrating a portion of the light emitting semiconductor device shown in FIG. 1 in an enlarged scale.

FIG. 1 illustrates a light emitting semiconductor device of a first preferred embodiment according to the present invention. FIG. 2 illustrates a portion of the light emitting semiconductor device shown in FIG. 1 in an enlarged scale. In the light emitting semiconductor device, for example, an underlying layer 3 comprising GaN of 2 μm thickness is laminated by way of a buffer layer 2 comprising GaN of 30 nm thickness in the laminating direction (hereinafter simply referred to as thickness) on a C face of a substrate 1 comprising sapphire. The buffer layer 2 comprises a crystal layer approximate to an amorphous state grown at a low temperature, which constitutes nuclei upon growing of the underlying layer 3. The underlying 3 comprises crystals and has about $1 \times 10^8$ to $1 \times 10^9 \text{N/cm}^2$ of threading dislocations M extending in the laminating direction as shown by fine lines in FIG. 2. The surface of the underlying layer 3 is made substantially planar.

On the underlying layer 3, are laminated alternately two or more layers of mask layers in each of which a plurality of opening areas 4c are disposed respectively (first mask layer 4a and a second mask layer 4b in this embodiment), and two or more layers of selective growing layers (first selective growing layer 5a and a second selective growing layer 5b in this embodiment) grown selectively by way of each of the mask layers 4a, 4b respectively. They are arranged in order to interrupt the threading dislocations M from propagating in the laminating direction from the underlying layer 3 by selectively growing each of the selective growing layers 5a, 5b in the lateral direction (direction perpendicular to the laminating direction) respectively on each of the mask layers 4a, 4b (refer to FIG. 2).

This lowers the density of the threading dislocations M in the selective growing layer at the uppermost layer (second selective growing layer 5b in this embodiment) to about $1 \times 10^3 \text{N/cm}^2$ or less compared with that in the underlying layer 3. Explanation will be made concretely to a case in which two mask layers (first mask layer 4a and second mask layer 4b) are formed.

The first mask layer 4a and the second mask layer 4b have, for example, from 100 to 200 nm thickness and are constituted with dielectric material such as silicon dioxide, silicon nitride ($Si_3N_4$) or aluminum oxide ($Al_2O_3$) respectively. Each of the first mask layer 4a and the second mask layer 4b has, for example, a plurality of strip-like mask areas 4d extended in <11-20> direction (direction perpendicular to the drawing in FIG. 1), respectively (namely, having a plurality of strip-like opening areas 4c extended in the <11-20> direction between each of the mask areas 4d). In each of the first mask layer 4a and the second mask layer 4b, a width (mask width) L1 for the mask areas 4d is, for example, 1.5–4 μm and a pitch width L2 is, for example, of 3 to 6 μm. The mask width L1 and the pitch width L2 are identical between the first mask layer 4a and the second mask layer 4b, respectively.

However, the positions for forming the opening areas 4c are different between the first mask layer 4a and the second mask layer 4b, such that the opening areas 4c of the first mask layer 4a are completely covered with the mask areas 4d of the second mask 4b as viewed in the laminating direction. They are so arranged to interrupt the threading dislocations M continued from the underlying layer 3 thorough the opening areas 4c of the first mask 4d by the second mask layer 4d (refer to FIG. 2). Accordingly, it is preferred that the mask width L1 in the first mask layer 4a and the second mask layer 4b is larger than the width L3 of the opening areas 4c (opening width). This is defined so as to effectively interrupt the threading dislocations M. The opening width L3 is as shown by an arrow in FIG. 2.

The first selective growing layer 5a and the second selective growing layer 5b are constituted, for example, with GaN respectively and the thickness for the sum of them is relatively thin as 10 μm or less (for example, about 7 to 8 μm). This is because the surface can be planarized with no thick lamination, by laminating the first mask layer 4a and the second mask layer 4b having different positions for forming the opening areas 4c, since a concave portion for the first selective growing layer 5a formed by selective growing can be grown preferentially by the second selective growing layer 5b.

The thickness of the first selective growing layer 5a is preferably as thin as possible and it is sufficient that the mask portion 4d of the first mask layer 4a is covered completely by the selective growing in the lateral direction.

That is, it may be in such a state in which the surface is not planar, such that a region situated above the opening area 4c is protruded, while a region situated above the mask areas 4d is concaved. This is because growing requires much time if the thickness is increased, to result in a problem such as occurrence of defects and warps caused by mismatching of lattice constant and thermal expansion coefficient relative to the substrate 1 made of sapphire. Further, the thickness of the second selective growing layer 5b is preferably such that it is sufficient to make the surface planar, so that a satisfactory semiconductor layer can be grown on the layer 5b.

On the second selective growing layer 5b, are laminated successively an n side contact layer 6 as a semiconductor layer, an n type cladding layer 7 as a first conduction type cladding layer, a first guiding layer 8, an active layer 9, a degradation preventive layer 10, a second guiding layer 11, a p type cladding layer 12 as a second conduction type cladding layer and a p type contact layer 13.

The n side contact layer 6 has, for example, 2 $\mu$m thickness and is constituted with n type GaN with addition of silicon (Si) as an n type impurity. The n type cladding layer 7 has, for example, 0.5 $\mu$m thickness and is constituted with n type AlGaN mixed crystals with addition of silicon as an n type impurity. The first guiding layer 8 has, for example, 0.1 $\mu$m thickness and is constituted with n type GaN with addition of silicon (Si) as an n type impurity. The active layer 9 is constituted, for example, with GaInN mixed crystals having a multiple quantum well structure having a well thickness of 3 nm and a barrier layer thickness of 4 nm.

The degradation preventive layer 10 or blocking layer against current overflow is constituted, for example, with AlGaN having 20 nm thickness. The second guiding layer 11 has, for example, 0.1 $\mu$m thickness and is constituted with p type GaN with addition of magnesium (Mg) as a p type impurity. The p type cladding layer 12 is constituted with AlGaN mixed crystals and having, for example, 0.5 $\mu$m thickness with addition of magnesium as p type impurity. The p side contact layer 13 has, for example, 0.5 $\mu$m thickness and is constituted with p type GaN mixed crystals with addition of magnesium as a p type impurity.

On the p side contact layer 13, are formed an insulation layer 14 comprising an insulation material such as silicon dioxide and a p side electrode 15 formed by way of an opening 14a disposed to the insulation layer 14. The p side electrode 15 comprises a constitution in which nickel (Ni) and gold (Au) are laminated successively from the side of the p-side contact layer 13. The p side electrode 15 is formed into a narrow strip-like shape (a strip-like shape extended in the direction vertical to the drawing in FIG. 1) in order to restrict current. Further, an n side electrode 16 is disposed on the n side contact layer 6, the electrode 16 comprising titanium (Ti), aluminum (Al) and gold (Au) laminated successively from the side of the n side contact layer 6.

Further, in the light emitting semiconductor device, reflection mirror layers are disposed respectively on a pair of lateral surfaces vertical to the longitudinal direction of the p side electrode 15 (that is, in the longitudinal direction of a resonator) although not illustrated.

A light emitting semiconductor device having thus been constituted can be manufactured as described below. FIG. 3 illustrates a portion of steps in a manufacturing method.

In the manufacturing method, a substrate 1 is at first provided and, a buffer layer 2 comprising GaN is formed on the C face, for example, by a MOCVD method. In this case, the temperature for the substrate 1 is set at 520° C. and trimethyl gallium gas ((CH$_3$)$_3$Ga) and ammonia gas (NH$_3$) are used as the starting material gas, for example. Then, an underlying layer 3 comprising GaN is formed on a buffer layer 2 in the same manner, for example, by a MOCVD method. However, the temperature of the substrate 1 is set at 1020° C. In the underlying layer 3, threading dislocations M at high concentration are present as shown by fine lines in FIG. 3A.

Successively, a first mask layer 4a comprising SiO$_2$ is formed on the underlying layer 3, for example, by a CVD (Chemical Vapor Deposition) method while setting the temperature of the substrate 1 to 450° C. Subsequently, a resist film not illustrated is coated and a plurality of parallel strip-like mask patterns are formed by photolithography, and etching is conducted using the pattern as a mask to selectively eliminate the first mask layer 4a thereby forming a plurality of strip-like mask areas 4d and a plurality of opening areas 4c extended in the <11-20> direction respectively.

After forming the first mask layer 4a, it is washed with acetone(CH$_3$COOCH$_3$) and methanol (CH$_3$OH) and, further, immersed in a diluted hydrochloric acid (HCl) or diluted hydrofluoric acid (HF) for about 10 sec and then cleaned with purified water.

Subsequently, a first selective growing layer 5a comprising GaN is selectively grown in a lateral direction on the first mask layer 4a, for example, by a halide vapor deposition method. The halide vapor deposition method means vapor deposition method in which halogen contributes to transportation or reaction (the halide vapor deposition method is also refereed to as a hydride vapor deposition method). In this case, the temperature of the substrate is set to 1000° C. and ammonia, metal gallium and hydrochloric acid are used as the starting material for instance. Specifically, after heating the substrate 1 to 1000° C. while flowing an ammonia gas at a flowrate of 2 liter/min, a gaseous hydrochloric acid is caused to flow on metallic gallium and a gallium chloride (GaCl) gas is supplied. The condition for supplying the GaCl gas is such that the flowing rate is about 20 $\mu$m/hr.

Figure 3A:
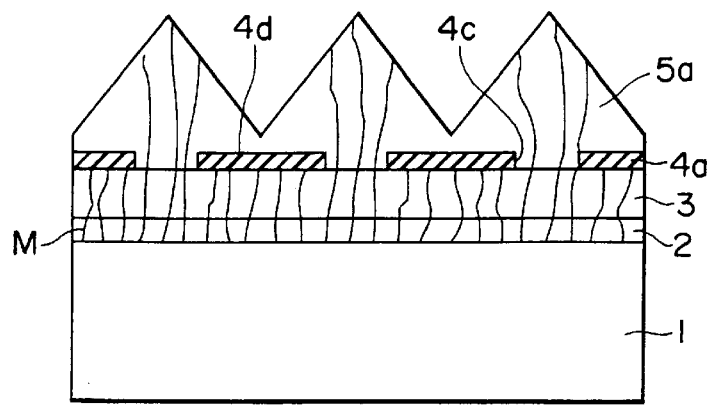
FIGS. 3A to 3C are cross sectional views illustrating steps of manufacturing the light emitting semiconductor device shown in FIG. 1.

Then, when conducting growing, for example, for 9 min, a first selective growing layer 5a in the form of protuberances each surrounded with the (1-101) face is formed above the opening areas 4c of the first mask layer 4a as shown in FIG. 3A. Then, in the first selective growing layer 5a, since the threading dislocations M from the underlying 3 are continued along the direction of the C axis (namely laminating direction) in the regions situating above the opening areas 4c of the first mask layer 4a, threading dislocations M are formed like that in the underlying layer 3. On the other hand, in the first selective growing layer 5a, since growing takes place in the lateral direction in the region situating above the mask areas 4d of the first selective growing layer 5a, threading dislocations M from the underlying layer 3 do not propagate and no threading dislocations M are formed. The growing time for the first selective growing layer 5a is preferably such that the first selective growing layer 5a is selectively grown in the lateral direction, completely covers the region above the mask areas 4d and further grows a little.

Figure 3B:
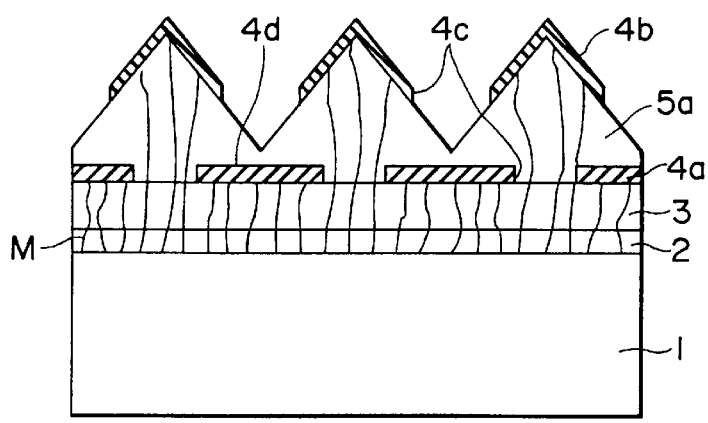

After forming the first selective layer 5a, as illustrated in FIG. 3B, a second mask layer 4b is formed thereover like that the first mask layer 4a, and a plurality of mask areas 4d and a plurality of opening areas 4c are formed respectively. However, in the second mask layer 4b, the opening areas 4c are formed at positions different from those in the first mask layer 4a, such that the opening areas 4c of the first mask layer 4a are completely covered with the mask areas 4d of the second mask layer 4b as viewed in the laminating direction. That is, the mask areas 4d of the second mask layer 4b are situated above the opening areas 4c of the first mask layer 4a, while the opening areas 4c of the second mask layer 4b are situated on the mask areas 4d of the first mask layer 4a. Thus, the opening areas 4c of the second mask layer 4b are formed corresponding to the recesses of the first selective layer 5a.

After forming the second mask layer 4b, it is cleaned with acetone and methanol, immersed in diluted hydrochloric acid or diluted fluoric acid for about 10 sec and cleaned with purified water.

Figure 3C:
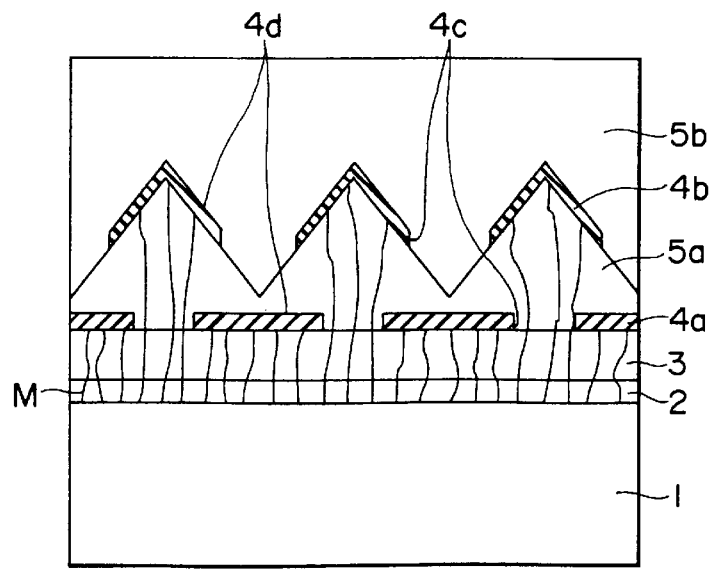

Subsequently, a second selective growing layer 5b is selectively grown in the lateral direction on the second mask layer 4b like that the first selective layer 5a. Thus, when conducting growing, for example, for 16 min, as shown in FIG. 3C, growing occurs preferentially in the regions above the opening areas 4c of the second mask layer 4b so as to fill the concaved recesses of the first selective layer 5a, to form a second selective growing layer 5b having a substantially planar surface. That is, the surface is planarized even if the first selective growing layer 5a and the second selective growing layer 5b are not grown to large thickness.

In this case, since growing occurs laterally in the second selective growing layer 5b, in the regions situating above the mask areas 4b of the second mask layer 4b, the threading dislocations M in the first selective growing layer 5a continued from the underlying layer 3 by way of the opening areas 4c of the first mask layer 4a are interrupted and no threading dislocations M are formed. Further, also in the regions of the second selective growing layer 5b situated above the opening areas 4b of the second mask layer 4b, since no threading dislocations M are present in the regions of the first selective growing layer 5a therebelow, no threading dislocations M are formed. Namely, the threading dislocations M are not formed for the entire surface in the second selective growing layer 5a.

The growing time for the selective growing layer 5b is preferably defined so as to be sufficient for planarizing the surface. By the way, when the first selective growing layer 5a and the second selective growing layer 5b are grown respectively under the conditions shown above, the surface is substantially planarized when the thickness is about 8 μm as a sum of the two layers.

After forming the second selective growing layer 5b as described above, each of semiconductor layers, namely, an n side contact layer 6, an n type cladding layer 7, a first guiding layer 8, an active layer 9, a second active layer 10, a p type cladding layer 12 and a p side second contact layer 13 are grown respectively thereover, for example, by a MOCVD method. In this case, the temperature of the substrate 1 is set to 800–1000° C. As starting material gases, are used trimethyl aluminum gas (($CH_3)_3Al$) for aluminum, trimethyl gallium gas for gallium, ammonia gas for nitrogen, monosilane gas ($SiH_4$) for silicon, and bis=methylcyclopentadienyl magnesium gas ($MeCp_2Mg$) or bis=cyclopentadienyl magnesium gas ($Cp_2Mg$) for magnesium, respectively for instance. Since no threading dislocations M are present in the second selective growing layer 5b, no threading dislocations M are formed in each of the semiconductor layers.

After forming each of the semiconductor layers respectively, an insulation film 14 comprising $SiO_2$ is formed on the p side contact layer 13, for example, by a CVD method. Then, a resist film not illustrated is coated on the insulation film 14 to form a mask pattern corresponding to the position for forming the p side electrode 14 by photolithography. Subsequently, etching is conducted by using the pattern as a mask and the insulation layer 14 is eliminated selectively to form an opening 14a corresponding to the position for forming the p side electrode 15.

Successively, nickel and gold, for instance, are evaporated successively for instance on the entire surface (namely, on the p side contact layer 13 from which the insulation layer 14 was eliminated selectively and on the not illustrated resist film), and the not illustrated resist film is eliminated (lift off) together with nickel and gold vapor deposited on the resist film, to form a p side electrode 15.

After forming the p side electrode 15, the insulation layer 14, the p side contact layer 13, the p type cladding layer 12, the second guiding layer 11, the degradation preventive layer 10, the active layer 9, the first guiding layer 8 and the n type cladding layer 7 are successively removed selectively corresponding to the position for forming the n side electrode 16. Subsequently, titanium, aluminum and gold are selectively vapor deposited successively on the n side contact layer 6 to form the n side electrode 16.

After forming the n side electrode 16, the substrate 1 is cleaved with a predetermined width in perpendicular to the longitudinal direction of the p side electrode 15 (longitudinal direction of a resonator), and a reflection mirror layer is formed on the cleaved surface. Thus, a light emitting semiconductor device shown in FIG. 1 is formed.

The device can also be fabricated if the formation of p-side electrode is followed after the formation of n-side electrode.

Further, the light emitting semiconductor device can also be manufactured as below. FIG. 4 illustrates a portion of steps in an other manufacturing method.

In this manufacturing method, at first, a substrate 1 is provided and a buffer layer 2 and an underlying layer 3 are formed like that in the previous manufacturing method. Then, after forming a first mask layer 4a on the underlying layer 3 like that in the previous manufacturing method, a plurality of mask areas 4d and a plurality of opening areas 4c are formed respectively and cleaning is conducted.

Successively, on the first mask layer 4a, a first selective layer 5a comprising GaN is selectively grown in the lateral direction, for example, by a MOCVD method. In this instance, the temperature of the substrate 1 is set to 1050° C., and ammonia and trimethyl gallium gases are used as the starting material gas for instance. More specifically, while flowing an ammonia gas at a somewhat large flow rate, for example, of 10 liter/min, a trimethyl gallium gas is supplied so as to attain a glowing speed of about 4 μm/hr and they are reacted at a normal pressure.

Figure 4A:
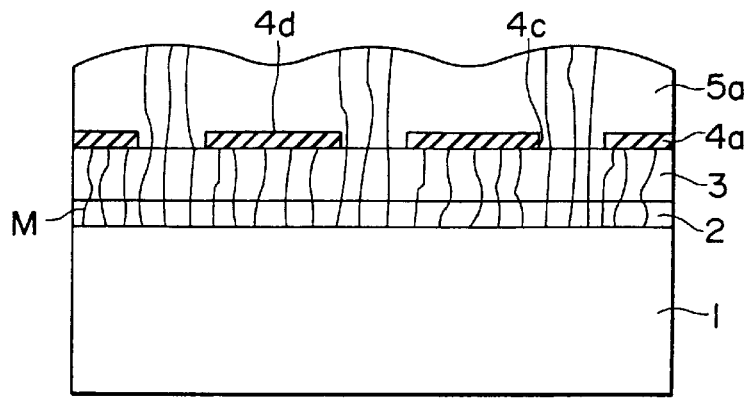
FIGS. 4A to 4C are cross sectional views illustrating other steps of manufacturing the light emitting semiconductor device shown in FIG. 1.

Thus, when growing is conducted, for example, for 45 min, as illustrated in FIG. 4A, a substantially planar first selective growing layer 5a is formed, being slightly bulged in the regions situated above the opening areas 4c of the first mask layer 4a of the first selective growing layer 5a. The threading dislocations M from the underlying layer 3 are continued and the threading dislocations N are formed like in the manufacturing method described previously. on the other hand, in the regions situated above the mask areas 4d of the first selective growing layer 5a, threading dislocations M from the underlying layer 4 are interrupted by the lateral growing and no threading dislocations are formed.

Figure 4B:
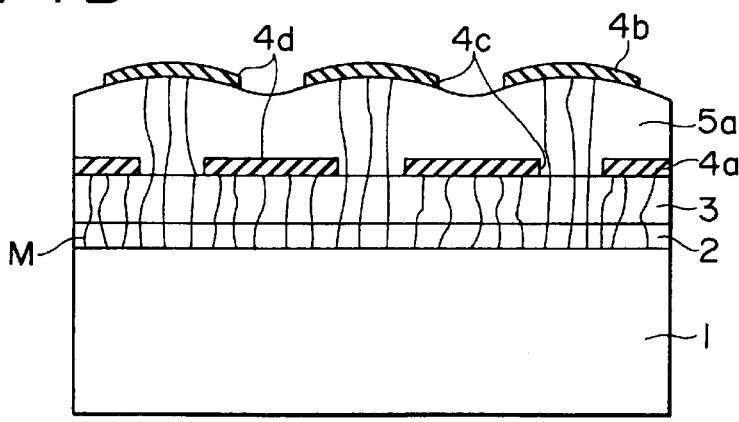

After forming the selective growing layer 5a, as illustrated in FIG. 4B, a second mask layer 4b is formed, and a plurality of mask areas 4a and a plurality of opening areas 4c are formed respectively thereover and cleaned in the same manner as in the manufacturing method described previously.

Figure 4C:
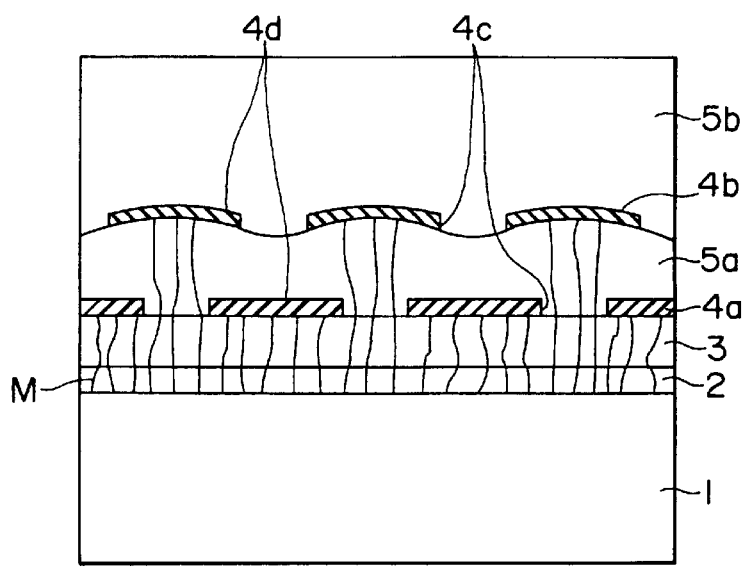

Subsequently, a second selective growing layer 5b is selectively grown in the lateral direction like that in the first selective growing layer 5a. Thus, when growing is conducted, for example, for one hour, as shown in FIG. 4C, a second selective growing layer 5b having a substantially planar surface is formed.

In this case, in the regions situated above the mask areas 4b of the second mask layer 4b, the threading dislocations M in the first selective growing layer 5a continued from the underlying layer 3 by way of the opening areas 4c of the first mask layer 4a are interrupted and no threading dislocations M are formed. Further, also in the regions situated above the opening areas 4b of second selective growing layer 5b, since no threading dislocations M are present in the regions of the first selective growing layer 5a therebelow, no threading dislocations M are formed. Namely, the threading dislocations M are not formed for the entire surface in the second selective growing layer 5a.

By the way, when the first selective growing layer 5a and the second selective growing layer 5b are grown respectively under the conditions shown above, the surface is made substantially made planar with a thickness of about 7 μm as a sum of the two layers in total.

After thus forming the second selective growing layer 5b, semiconductor layers, namely, an n side contact layer 6, an n type cladding layer 7, a first guiding layer 8, an active layer 9, a second active layer 10, a p type cladding layer 12 and a p side contact layer 13 are grown respectively. Then, in the same manner as in the manufacturing method described previously, an insulation layer 14, a p side electrode 15 and a n side electrode 16 are formed and cleaved to a predetermined width to form reflection mirror layer. Thus, a light emitting semiconductor device shown in FIG. 1 is formed.

The light emitting semiconductor device manufactured as described above functions as below.

In the light emitting semiconductor device, when a predetermined voltage is applied between the n side electrode 16 and the p side electrode 15, current is injected to the active layer 9 to emit light by electron-hole recombination. In this embodiment, since the first mask layer 4a and the second mask layer 4b, and the first selective growing layer 5a and the second selective growing layer 5b are disposed alternately between the substrate 1 and the semiconductor layers (n side contact layer 6, n type cladding layer 7, first guiding layer 8, active layer 9, degradation preventive layer 10, second guiding layer 11, p type cladding layer 12 and p side contact layer 13), they interrupt propagation of the threading dislocations M in the laminating direction to lower the density of the threading dislocations M in the semiconductor layer. Accordingly, less degradation is caused by the application of voltage and increase of the driving current during use is suppressed to extend the working life of the device.

As described above, in the light emitting semiconductor device according to this embodiment, since the first mask layer 4a and the second mask layer 4b, as well as the first selective growing layer 5a and the second selective growing layer 5b are disposed alternately, the thickness of the first selective growing layer 5a and the second selective growing layer 5b can be reduced and the density of the threading dislocations M can be lowered over the entire surface. Therefore, defects or warps due to the mismatching of lattice constant and thermal expansion coefficient relative to the substrate 1 made of sapphire can be prevented to maintain the quality of the device, and increase of the driving current during use can be suppressed to extend the working life of the device.

Further, according to the light emitting semiconductor device, since the opening areas 4c of the first mask layer 4a are completely covered with the mask areas 4d of the second mask layer 4b in the laminating direction, propagation of the threading dislocations M from the underlying layer 3 can be interrupted effectively.

Further, in the method of manufacturing the light emitting semiconductor device according to this embodiment, since the first mask layer 4a and the second mask layer 4b, as well as the first selective growing layer 5b and the second selective growing layer 5b are laminated alternately and, subsequently, respective semiconductor layers (n side contact layer 6, n type cladding layer 7, first guiding layer 8, active layer 9, second active layer 10, p type cladding layer 12 and p side contact layer 13) are laminated respectively, the thickness of the first selective growing layer 5a and the second growing layer 5b can be reduced and the density of the threading dislocations M can be lowered over the entire surface. Therefore, the growing time can be shortened to improve the manufacturing efficiency, as well as the positions of forming light emitting regions are not restricted to increase the degree of freedom in manufacture, so that the light emitting semiconductor device according to the present invention can be manufactured easily.

In addition, when the second growing layer 5b is formed by the method identical with that for the semiconductor layers to be laminated thereon (MOCVD method in this method), they can be grown continuously, to prevent intrusion of impurities and simplify the manufacturing steps.

Figure 5:
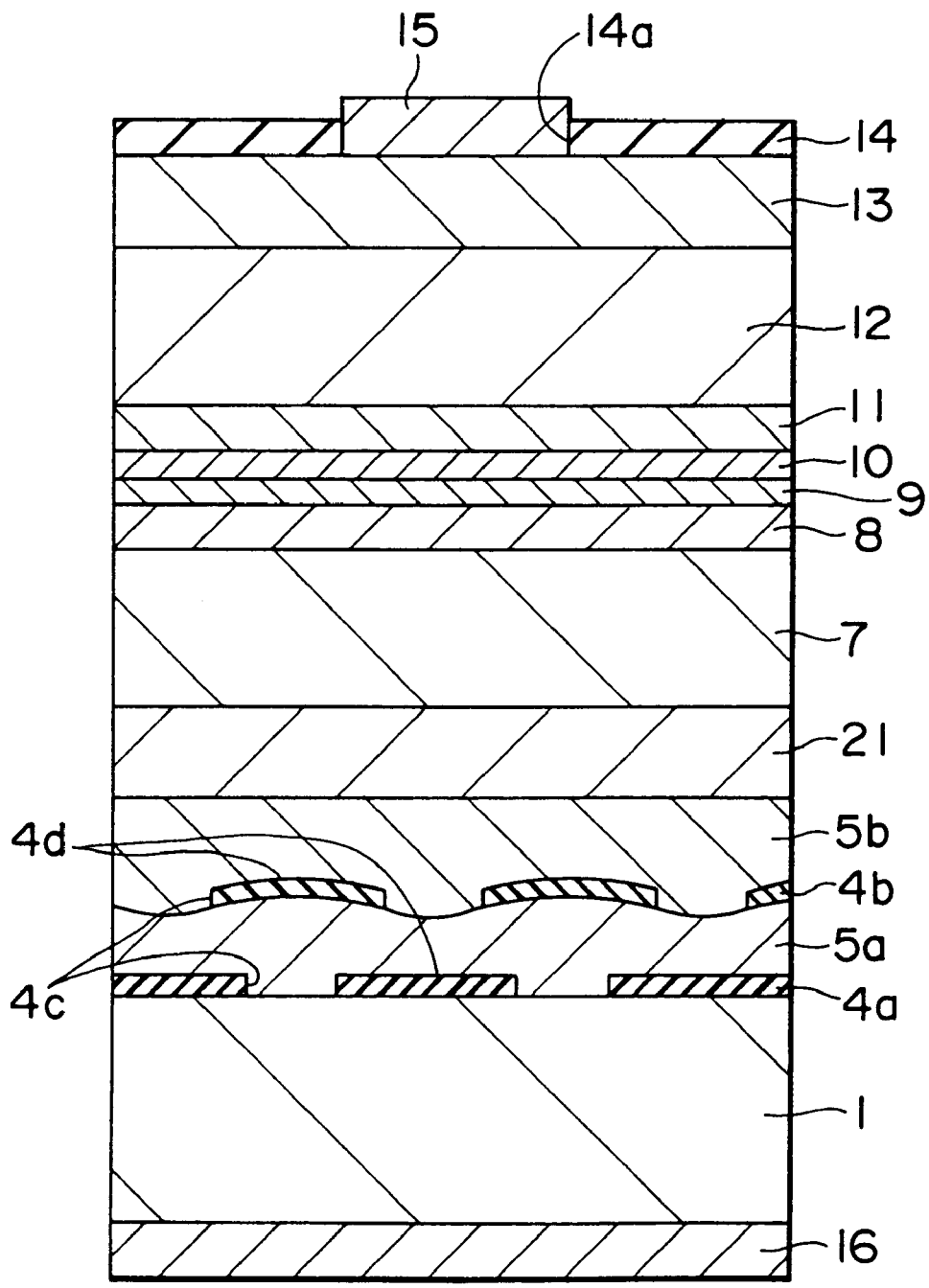
FIG. 5 is a cross sectional view illustrating a constitution of a light emitting semiconductor device in a second embodiment according to the present invention.

FIG. 5 illustrates a light emitting semiconductor device according to a second embodiment of the present invention. The second embodiment has a constitution identical with that of the first embodiment excepting that a substrate 1 is constituted, for example, with n type single crystal gallium GaN with addition of silicon as an n type impurity, an n side electrode 16 is formed to the rear face of the substrate 1, a first mask layer 4a is formed directly on the substrate 1, and an underlying layer 21 is disposed between a second selective growing layer 5b and an n type cladding layer 7. Therefore, constituent elements, identical with those of the first embodiment carry the same reference numerals for which detailed explanation will be omitted.

Namely, in the light emitting semiconductor device, the substrate 1 is constituted with a conductive material, and the n side electrode 16 is formed on the rear face of the substrate 1. Further, the substrate 1 is constituted with a group III nitride compound semiconductor identical with that for the semiconductor layer on which the substrate 1 is to be formed, so that the first mask layer 4a and the first growing layer 5a can be laminated directly on the substrate 1. Since conductivity is necessary for the selective growing layer 5 different from the first embodiment, it is constituted, for example, with an n type GaN with addition of silicon as an n type impurity. Further, the underlying layer 21 is constituted, for example, with an n type GaN with addition of silicon as an n type impurity.

The light emitting semiconductor device having the foregoing constitution can be manufactured in the same manner as the first embodiment, as well as operates in the same manner as the first embodiment and has the identical effect with that of the first embodiment.

The present invention has been explained with reference to each of preferred embodiments. However, the invention is not restricted to each of the embodiments described above but various modifications are possible. For example, in each of the embodiments described above, explanations have been made, referring to concrete examples to semiconductors comprising the buffer layer 2, the underlying layers 3, 21, the selective growing layer 5, the n side contact layer 6, the n type cladding layer 7, the first guiding layer 8, the active layer 9, the degradation preventive layer 10, the second guiding layer 11, the p type cladding layer 12 and the p side contact layer 13, respectively, but the present invention is applicable also to a case of constituting each of the layers by other appropriate semiconductors. However, the present invention is particularly effective in a case of constituting each of the layers with an appropriate group III nitride compound semiconductor (that is, a group III nitride compound semiconductor containing at least one group III element selected from the group consisting of gallium, aluminum, boron and indium, and nitrogen).

Further, in each of the embodiments described above, explanations have been made concretely to a case of having two mask layers (first mask layer 4a and second mask layer 4b) but a device comprising three or more mask layers can be constituted in the same manner and manufactured in the same way. In each of the embodiments described above, the opening areas 4c of the first mask layer 4a are completely covered with the mask areas 4d of the second mask 4b as viewed in the laminating direction but it may also be covered completely by mask areas of a plurality of mask layers. Namely, it may suffice that positions for forming opening areas of at least one mask layer different from those of at least one other mask layer, and the opening areas are completely covered with mask areas of at least one other mask layer as viewed in the laminating direction.

In each of the embodiments described above, strip-like opening areas 4c and mask areas 4d are disposed to the first mask layer 4a and the second mask layer 4b respectively, but the shape for the opening areas 4c and the mask areas 4d may be optional and it may suffice that the opening areas of at least one mask layer are completely covered with mask areas of at least one other mask layer as viewed in the laminating direction.

In addition, in each of the embodiments described above, the first mask layer 4a and the second mask layer 4b are constituted with a dielectric material, but they may be constituted with other materials provided that growing of the first selective growing layer 5a and the second selective growing 5b in the laminating direction can be inhibited.

Furthermore, in the first embodiment described above, the first mask layer 4a and the first selective growing layer 5a are formed respectively on the underlying layer 3 but they may also be formed respectively on the buffer layer.

In addition, in each of the embodiments described above, explanations have been made to the light emitting semiconductor device in which the active layer 9 is sandwiched between the first guiding layer 8 and the second guiding layer 22 and, further, they are sandwiched between the n type cladding layer 7 and the p type cladding layer 12. However, the present invention is applicable also to a light emitting semiconductor device having various structures, for example, a structure in which an active layer is put between the cladding layers with no intervention of the guiding layers.

Further, in each of the embodiments described above, explanations have been made concretely with reference to a semiconductor laser as the semiconductor light emitting device, but the present invention is applicable also to other light emitting semiconductor devices such as LEDs.

Further, in each of the embodiments described above, explanations have been made only to the light emitting semiconductor device, but the present invention is applicable also to other semiconductor devices, for example, FET (Field Effect Transistor).

Further, in each of the embodiments described above, explanations have been made to a case of growing the first selective growing layer 5a and the second selective growing layer 5b by the MOCVD method or the halide vapor deposition method, but it may be grown also by other vapor deposition methods such as a molecular beam epitaxy (MBE) method.

Further, in each of the embodiments describe above, explanations have been made to a case of forming the buffer layer 2, the underlying layers 3, 21, the n side contact layer 6, the n type cladding layer 7, the first guiding layer 8, the active layer 9, the degradation preventive layer 10, the second guiding layer 11, the p type cladding layer 12 and the p side contact layer 13, respectively, by the MOCVD method, but they may be formed also by other vapor deposition methods such as a MBE method or a halide method.

Further, in each of the embodiments described above, explanations have been made to conditions upon growing the first selective growing layer 5a and the second selective growing layer 5b with reference to concrete examples, but they may be grown also under other various conditions. For example, also in a case of growing by the halide vapor deposition method, the second selective growing layer 5b with a relatively planar surface can be grown as shown in the second embodiment by adopting conditions different from those for the first embodiment. Growing of the second selective growing layer 5b having a relatively planar surface as described above is preferred since the mask layers 4a, 4b can be easily formed thereon.

As has been described above, according to the semiconductor device as defined in any one of the features described above (corresponding to appended claims 1 to 10), since two or more of mask layers and selective growing layers are provided alternately, the thickens of the selective growing layers can be reduced and the density of the threading dislocations can be lowered over the entire surface. Accordingly, this can provide an advantageous effect capable of preventing formation of defects or warps caused by mismatching of lattice constant and thermal expansion coefficient relative to a substrate, for example, made of sapphire to maintain the quality of the device, as well as capable of improving the quality of the device due to the lowering of the threading dislocations.

Further, according to the method of manufacturing the semiconductor device as defined in other features described above (corresponding to appended claims 11 to 21), since two or more mask layers and selective growing layers are respectively laminated alternately and then semiconductor layers are laminated, the thickness of the selective growing layers can be reduced and the density of the threading dislocations can be lowered over the entire surface. Accordingly, this can provide an advantageous effect capable of shortening the growing time to improve the manufacturing efficiency and increasing the degree of freedom in manufacture thereby easily manufacturing a semiconductor device of the present invention.

Then, according to the light emitting semiconductor device in further features as described above (corresponding to appended claims 22 to 31), since constitutions identical with those of the semiconductor device according to the present invention are provided, the thickness of the selective growing layers can be reduced and the density of the threading dislocations can be lowered over the entire surface like that the semiconductor device according to the present invention. Accordingly, this can provide an advantageous effect capable of preventing formation of defects or warps caused by mismatching of lattice constant and thermal expansion coefficient relative to the substrate, for example, made of sapphire to maintain the quality of the device, and suppressing increase of the driving current during use to extend the working life of the device.

What is claimed is:

1. A semiconductor device comprising a mask layer in which opening areas are formed and a selective growing layer comprising a semiconductor which is grown selectively by way of the mask layer, with the mask layer and the selective growing layer being disposed each by two or more layers alternately.

2. A semiconductor device as defined in claim 1, wherein the positions for forming the opening areas in at least one of a plurality of the mask layers are different from those of at least one other layer thereof, and the opening areas in at least one layer are covered completely by the mask areas of at least one other layer as viewed in the laminating direction.

3. A semiconductor device as defined in claim 1, wherein the mask layer comprises a dielectric material.

4. A semiconductor device as defined in claim 3, wherein the mask layer comprises silicon dioxide, silicon nitride or aluminum oxide.

5. A semiconductor device as defined in claim 1, wherein a semiconductor layer is laminated on a substrate by way of the mask layers and the selective growing layers, and the semiconductor layer comprises a group III nitride compound semiconductor containing at least one element belonging to the group III of the periodical table and selected from the group consisting of gallium (Ga), aluminum (Al), boron (B) and indium (In), and nitrogen (N).

6. A semiconductor device as defined in claim 5, wherein the selective growing layer comprises a group III-nitride compound semiconductor containing gallium and nitrogen.

7. A semiconductor device as defined in claim 5, wherein the substrate comprises sapphire.

8. A semiconductor device as defined in claim 7, wherein the mask layers are formed on the substrate by way of a buffer layer.

9. A semiconductor device as defined in claim 5, wherein the substrate comprises single crystals of gallium nitride.

10. A semiconductor device as defined in claim 9, wherein the mask layers are formed directly on the substrate.

11. A light emitting semiconductor device in which a first conduction type cladding layer, an active layer and a second conduction type cladding layer each comprising a semiconductor are at least laminated successively on the substrate, wherein a mask layer in which opening areas are formed and a selective growing layer comprising a semiconductor which is grown selectively by way of the mask layer, with the mask layer and the selective growing layer being disposed each by two or more layers alternately, are laminated between the substrate and the first conduction type cladding layer.

12. A light emitting semiconductor device as defined in claim 11, wherein the positions for forming the opening areas in at least one of a plurality of the mask layers are different from those of at least one other layer thereof, and the opening areas in at least one layer are covered completely by the mask areas of at least one other layer as viewed in the laminating direction.

13. A light emitting semiconductor device as defined in claim 11, wherein the mask layer comprises a dielectric material.

14. A light emitting semiconductor device as defined in claim 11, wherein the substrate comprises sapphire.

15. A light emitting semiconductor device as defined in claim 14, wherein the mask layer is formed by way of a buffer layer on the substrate.

16. A light emitting semiconductor device as defined in claim 11, wherein the substrate comprises single crystals of gallium nitride.

17. A single crystal gallium nitride semiconductor device as defined in claim 16, wherein the mask layers are formed directly on the substrate.

* * * * *